United States Patent
Yeh et al.

(10) Patent No.: US 9,324,907 B2
(45) Date of Patent: Apr. 26, 2016

(54) GALLIUM-NITRIDE-BASED LIGHT EMITTING DIODES WITH MULTIPLE POTENTIAL BARRIERS

(71) Applicant: XIAMEN SANAN OPTOELECTRONICS TECHNOLOGY CO., LTD., Xiamen (CN)

(72) Inventors: Meng-Hsin Yeh, Xiamen (CN); Jyh-Chiarng Wu, Xiamen (CN); Guojun Lu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 194 days.

(21) Appl. No.: 13/743,728

(22) Filed: Jan. 17, 2013

(65) Prior Publication Data

US 2013/0187125 A1 Jul. 25, 2013

(30) Foreign Application Priority Data

Jan. 20, 2012 (CN) .......................... 2012 1 0017954

(51) Int. Cl.
   H01L 33/06 (2010.01)
   H01L 33/00 (2010.01)
   H01L 29/15 (2006.01)
   H01L 21/02 (2006.01)
(52) U.S. Cl.
   CPC .......... *H01L 33/06* (2013.01); *H01L 21/02507* (2013.01); *H01L 29/15* (2013.01); *H01L 33/007* (2013.01); *H01L 33/0075* (2013.01)
(58) Field of Classification Search
   None
   See application file for complete search history.

(56) References Cited

U.S. PATENT DOCUMENTS

| 6,337,493 B1 * | 1/2002 | Tanizawa et al. ............... 257/79 |
| 6,555,403 B1 * | 4/2003 | Domen ................. B82Y 20/00 257/10 |
| 2004/0051107 A1 * | 3/2004 | Nagahama et al. ............. 257/79 |
| 2010/0270591 A1 * | 10/2010 | Ahn ............................. 257/194 |
| 2011/0001123 A1 * | 1/2011 | Kim et al. ........................ 257/13 |
| 2011/0037049 A1 | 2/2011 | Tachibana et al. |
| 2011/0168977 A1 * | 7/2011 | Eichler et al. ................... 257/13 |

FOREIGN PATENT DOCUMENTS

| CN | 16691518 A | 9/2005 |
| CN | 1747187 A | 3/2006 |
| CN | 101027791 A | 8/2007 |

OTHER PUBLICATIONS

Aumer et al. "Effects of tensile and compressive strain on the luminescence properties of AlInGaN/InGaN quantum well structures", Applied Physics Letters 77, 821 (2000).*
First Office Action in CN Appl. No. 201210017954.4 mailed on Jul. 3, 2013.

* cited by examiner

*Primary Examiner* — Whitney T Moore
*Assistant Examiner* — Scott R Wilson
(74) *Attorney, Agent, or Firm* — Syncoda LLC; Feng Ma; Junjie Feng

(57) ABSTRACT

A light emitting diode (LED) includes an active layer having one or more multilayer potential barriers and at least one well layer. Each multilayer potential barrier includes interlacing first and second InAlGaN thin layers. The first and second InAlGaN thin layers have compositions selected with respect to the well layer such that a polarization effect is substantially reduced.

20 Claims, 9 Drawing Sheets

GALLIUM-NITRIDE-BASED LIGHT EMITTING DIODES WITH MULTIPLE POTENTIAL BARRIERS

CROSS-REFERENCE TO RELATED APPLICATIONS

The present application is a continuation of, and claims priority to, Chinese Patent Application No. 201210017954.4 filed on Jan. 20, 2012, the disclosure of which is hereby incorporated by reference in its entirety.

BACKGROUND

Gallium nitride (GaN) based light-emitting diodes (LEDs) have been widely used in applications such as cell phone keys, signs for directions, signage, displays, backlighting, and lighting systems. Many of these systems may employ a plurality of LEDs as light sources. As the efficiency of power GaN-based LEDs is continuously improved, it becomes practical to replace conventional lighting sources with these LEDs.

SUMMARY

In an aspect, an LED is provided including an active layer, the active layer including one or more multilayer potential barriers and a well layer. Each multilayer potential barrier includes interlacing first and second InAlGaN thin layers, wherein the first and second InAlGaN thin layers have compositions selected with respect to the well layer such that a polarization effect is substantially reduced.

In some embodiments, the LED further includes a substrate; a GaN-based n-layer disposed over the substrate; and a GaN-based p-layer disposed over the substrate.

In some embodiments, the first and second InAlGaN thin layers form a superlattice structure with a period of at least two.

In some embodiments, the first thin layers are $Al_{x1}In_{y1}Ga_{1-x1-y1}N$ layers with $0<x1<1$, $0<y1<1$, $x1+y1<1$, the second thin layers are $Al_{x2}In_{y2}Ga_{1-x2-y2}N$ layers with $0 \le x2<1$, $0<y2<1$, $x2+y2<1$, and wherein $x1 \ne x2$, $y1 \ne y2$.

In some embodiments, the multilayer potential barrier structure has a thickness of $\le 600$ Å.

In some embodiments, the first thin layers each have a thickness of 5 Å-50 Å, with an n-type doping density $<5 \times 10^{18}$ cm$^{-3}$.

In some embodiments, the second thin layers each have a thickness of 5 Å-50 Å, with an n-type doping density $<5 \times 10^{18}$ cm$^{-3}$.

In some embodiments, the first thin layers each have substantially the same compositions of Al, In, and Ga.

In some embodiments, within each first thin layer the Al, In, and Ga compositions are variable such that the first thin layer has a non-rectangular-shaped barrier structure.

In some embodiments, the first thin layers each have different compositions of Al, In, and Ga.

In some embodiments, the first thin layers have gradually decreasing barrier height and then gradually increasing barrier heights toward the well layer.

In some embodiments, the second thin layers each have the same compositions of Al, In, and Ga.

In some embodiments, the second thin layers each have different compositions of Al, In, and Ga.

In some embodiments, the second thin layers have gradually lower well depth along a lattice growth direction on each side of the well layer.

In some embodiments, the first thin layers are formed to have gradually decreasing barrier height and then gradually increasing barrier heights toward the well layer.

In an aspect, a method of manufacturing a light-emitting diode (LED) is provided, the method including interlacing first and second InAlGaN thin layers to form a multilayer potential barrier superlattice structure; forming a well layer adjacent the multilayer potential barrier superlattice structure; wherein the first and second InAlGaN thin layers have compositions selected with respect to the well layer such that a polarization effect is substantially reduced, wherein the well layer and the multilayer potential barrier superlattice structure are part of an active layer of the LED, and wherein first thin layers are $Al_{x1}In_{y1}Ga_{1-x1-y1}N$ layers with $0<x1<1$, $0<y1<1$, $x1+y1<1$, the second thin layers are $Al_{x2}In_{y2}Ga_{1-x2-y2}N$ layers with $0 \le x2<1$, $0<y2<1$, $x2+y2<1$, wherein $x1 \ne x2$, $y1 \ne y2$.

In some embodiments, the second thin layers are formed to have gradually lower well depth along a lattice growth direction on each side of the well layer.

In some embodiments, the first thin layers are formed to have gradually decreasing barrier height and then gradually increasing barrier heights toward the well layer.

In some embodiments, a display, signage, or lighting system is provided including a plurality of light-emitting diodes (LEDs), wherein each LED includes an active layer including: one or more multilayer potential barriers; and a well layer; wherein each multilayer potential barrier includes: interlacing first and second InAlGaN thin layers, wherein the first and second InAlGaN thin layers have compositions selected with respect to the well layer such that a polarization effect is substantially reduced, wherein first thin layers are $Al_{x1}In_{y1}Ga_{1-x1-y1}N$ layers with $0<x1<1$, $0<y1<1$, $x1+y1<1$, the second thin layers are $Al_{x2}In_{y2}Ga_{1-x2-y2}N$ layers with $0 \le x2<1$, $0<y2<1$, $x2+y2<1$, wherein $x1 \ne x2$, $y1 \ne y2$, wherein the second thin layers are formed to have gradually lower well depth along a lattice growth direction on each side of the well layer.

In some embodiments, the first thin layers are formed to have gradually decreasing barrier height and then gradually increasing barrier heights toward the well layer.

DETAILED DESCRIPTION

Figure 1:
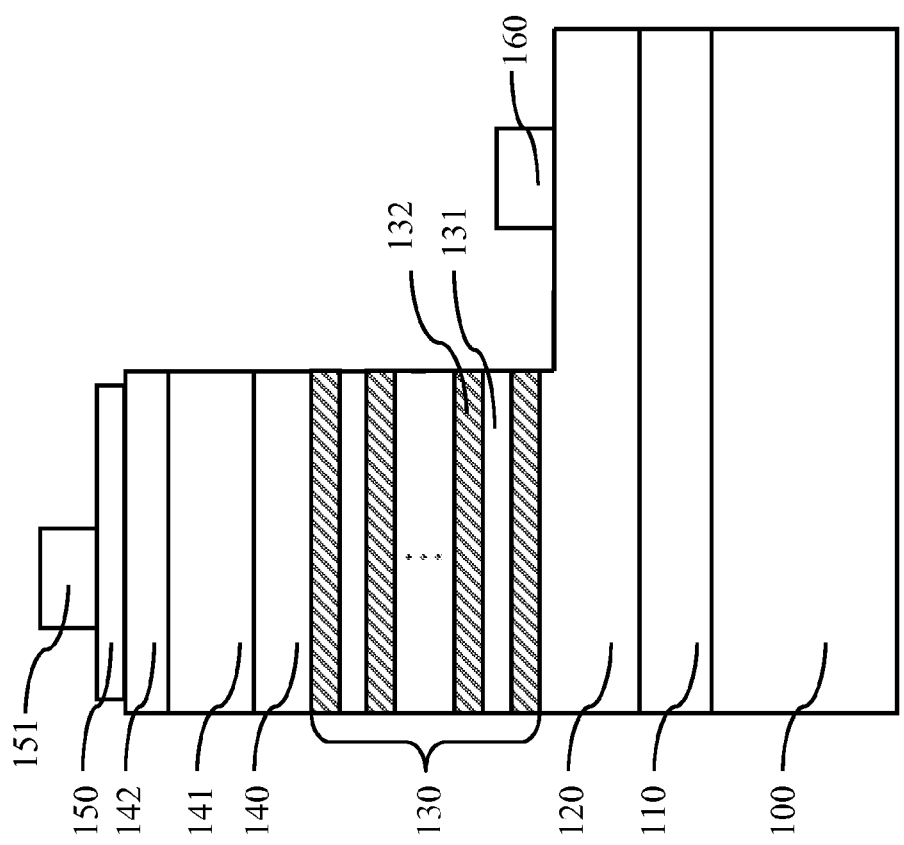
FIG. 1 illustrates an LED structure according to some embodiments.

For semiconductor lighting to become more popular, light-emitting brightness and light-emitting efficiency should be further improved. For example, it may be desirable for white LEDs to have a light-emission efficiency of 100 lm/W or higher. The effect of sudden drop in light-emission efficiency of the LEDs under large current (Droop Effect) may need to be reduced. In conventional nitride-based LED active layers, the potential barrier layers typically are composed of GaN materials, and the well layers typically are composed on InGaN. The lattice mismatch between GaN and InGaN materials can result in significant polarization effect, leading to the Droop Effect.

By improving the designs of the device surface electrodes, current crowding may be reduced, and excessively high local electrical current density may thus be reduced. This can improve the Droop Effect under large current operations. However, the fabrication techniques of these chips may be very complex.

Embodiments disclosed herein provide nitride LED structures with reduced Droop effect, improved light-emission efficiency and other advantages.

For example, a GaN-based LED is provided with a multi-layer potential barrier structure. The LED may include: a substrate; an n-side layer and a p-side layer respectively formed with nitride semiconductor, an active layer between the n-side layer and the p-side layer. The active layer may include a well layer and a multilayer potential barrier structure. The multilayer potential barrier structure may include a first InAlGaN thin layer, and a second InAlGaN thin layer. Multiple first and second InAlGaN thin layers may be repeatedly stacked to form the multilayer barrier structure layer.

The multilayer potential barrier structure can be a superlattice structure formed by repeatedly stacking the first InAlGaN thin layers and the second InAlGaN thin layers, wherein the number of repetition can be at least two.

The first InAlGaN thin layers may be composed of $Al_{x1}In_{y1}Ga_{1-x1-y1}N$, wherein $0<x1<1$, $0<y1<1$, $x1+y1<1$, the second InAlGaN thin layers may be composed of $Al_{x2}In_{y2}Ga_{1-x2-y2}N$, $0\leq x2<1$, $0<y2<1$, $x2+y2<1$, wherein $x1\neq x2$, $y1\neq y2$.

In some implementations, the multilayer potential barrier structure can have a thickness less than or equal to 600 Å.

In some implementations, the first InAlGaN thin layer can have a thickness of 5 Å~50 Å, with an n-type doping density less than $5\times10^{18}$ cm$^{-3}$.

The second InAlGaN thin layer can have a thickness of 5 Å~50 Å, with an n-type doping density less than $5\times10^{18}$ cm$^{-3}$. In some preferred embodiments, the second InAlGaN thin layer may have a thickness of 10 Å~30 Å, where $0<x2<0.2$, $0.05<y2<0.4$, $x2+y2<1$.

The first InAlGaN thin layer can have fixed or variable compositions of Al, In, Ga. The second InAlGaN thin layer can have fixed or variable compositions of Al, In, Ga.

In some embodiments, the Al and In compositions, the thickness, and the repetition number of the first and second InAlGaN thin layers may be adjusted, and the potential barrier of the active layer forms a superlattice structure. The potential barrier therefore can be lattice matched with the well layer, thereby reducing the polarization effect caused by the lattice mismatch between the well layer and the potential barrier layer in the active layer of conventional nitride structures. As a result, the Droop effect under large current operations can be significantly reduced, and the light-emission efficiency of the nitride LEDs can be significantly improved.

Further, the repetitive stacking of the first and second InAlGaN thin layers can form a polarization matching and high potential barrier multilayer potential barrier structure, lattice matched with the well layer (e.g., composed of InGaN materials). Without significant polarization effect, under the operations of different currents, there is no obvious blue shift or red shift.

FIG. 1 illustrates a structure of a GaN-based LED according to some embodiments. As shown, the LED has a multi-layer potential barrier structure. The LED may include substrate 100, buffer layer 110, n-type layer 120, active layer 130, p-type confining layer 140, a p-type cap layer 141, a p-type contact layer 142, a p-type ohmic electrode 150, a p-pad electrode 151, an n-type ohmic electrode 160. Active layer 130 may include well layer 131, and multilayer potential barrier structure layer 132.

Substrate 100 can be a sapphire substrate. Buffer layer 110 can be formed over substrate 100, and can comprise GaN, AlN, or AlGaN, with a thickness of 200 Å~500 Å. N-type layer 120 can be formed over buffer layer 110, and can comprise Si-doped GaN, with a thickness of 20000 Å~40000 Å.

Active layer 130 may be formed over n-type layer 120, and can have a quantum well structure comprising stacked well layers 131 and multilayer potential barrier structure layers 132. It may be noted that although active layer 130 as illustrated in FIG. 1 is a multiple-quantum-well structure, the active layer can also be a single-quantum-well structure in some other embodiments. Well layer 131 may comprise InGaN, with a thickness of 18 Å~30 Å. Multilayer potential barrier structure layer 132 may be a superlattice structure formed by interlacing first $Al_{x1}In_{y1}Ga_{1-x1-y1}N$ thin layers 132a and second $Al_{x2}In_{y2}Ga_{1-x2-y2}N$ thin layers 132b. The number of repetition can be at least two. The total thickness may be less that or equal to 600 Å, with an optimal thickness of 100 Å~200 Å, according to some embodiments.

Figure 2:
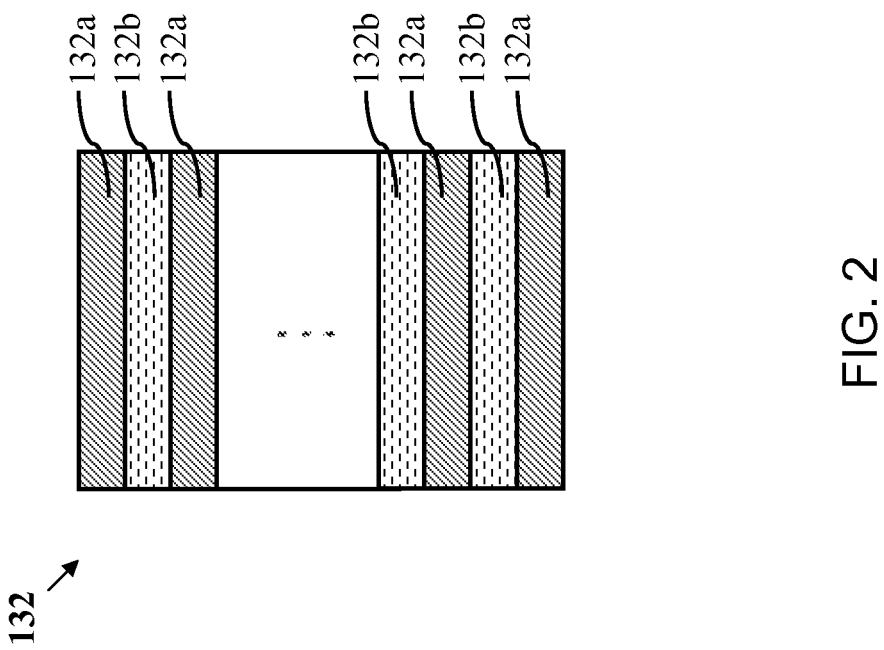
FIG. 2 is an amplified view of the multilayer potential barrier according to some embodiments.

Some embodiments of the multilayer potential barrier structure layer 132 are illustrated in FIG. 2. The first $Al_{x1}In_{y1}Ga_{1-x1-y1}N$ thin layers 132a may each have a thickness of 5 Å~50 Å, with an optimal thickness range of 10 Å~30 Å according to some embodiments. Their n-type doping concentration may be less than $5\times10^{18}$ cm$^{-3}$. According to some embodiments, $0.1<x1<0.45$, $0.2<y1<0.4$, $x1+y1<1$. The second $Al_{x2}In_{y2}Ga_{1-x2-y2}N$ thin layers 132b may each have a thickness of 5 Å~50 Å, with an optimal thickness range of 10 Å~30 Å according to some embodiments. Their n-type doping concentration may be less than $5\times10^{18}$ cm$^{-3}$. According to some embodiments, $0<x2<0.2$, $0.05<y2<0.4$, $x2+y2<1$.

As illustrated, multilayer potential barrier structure layer 132 is a superlattice structure formed by interlacing first $Al_{x1}In_{y1}Ga_{1-x1-y1}N$ thin layer 132a and second $Al_{x2}In_{y2}Ga_{1-x2-y2}N$ thin layers. The Al concentration in the first thin layer 132a is larger than the Al concentration in the second thin layer 132b, that is, x1>x2. By adjusting the Al and In concentrations in the first and second thin layers, the thin layer thicknesses, and the repetition number, the potential barrier can be made lattice matched with the well layer. As such, the polarization effect caused by lattice mismatch between the well layer and the potential barrier layer in convention structures may be reduced. In addition, a high potential barrier can be realized. The Al and In concentrations in the first and second thin layer 132a, 132b can be fixed according to some embodiments, or can be variable according to some other embodiments.

Figure 3:
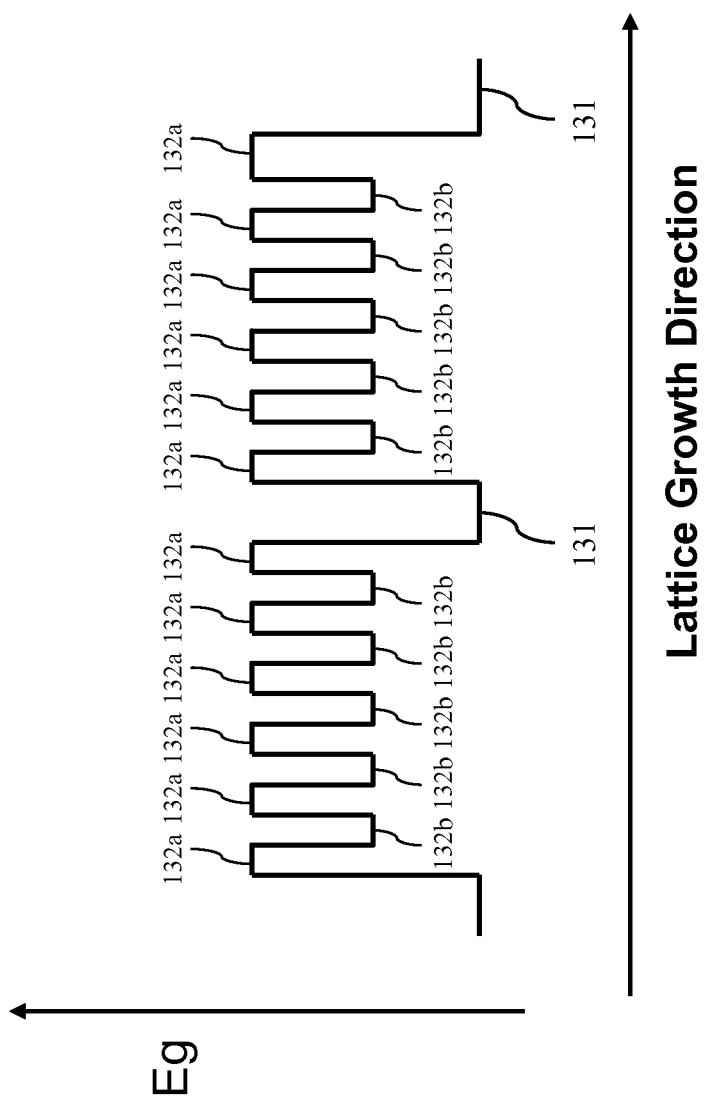
FIG. 3 illustrates the band gap distribution of the active layer in a first embodiment.

FIG. 3 illustrates the band gap distribution of the active layer in the first embodiment. In this embodiment, the first thin layers 132a and the second thin layers 132b have fixed Al and In concentrations. Multilayer potential barrier structure 132 comprises six first thin layers 132a and five second thin layers 132b in this embodiment. As shown, first thin layers 132a have rectangular-shaped barrier structure with the same barrier heights, and second thin layers 132b have rectangular-shaped well structure with the same well depths.

Figure 4:
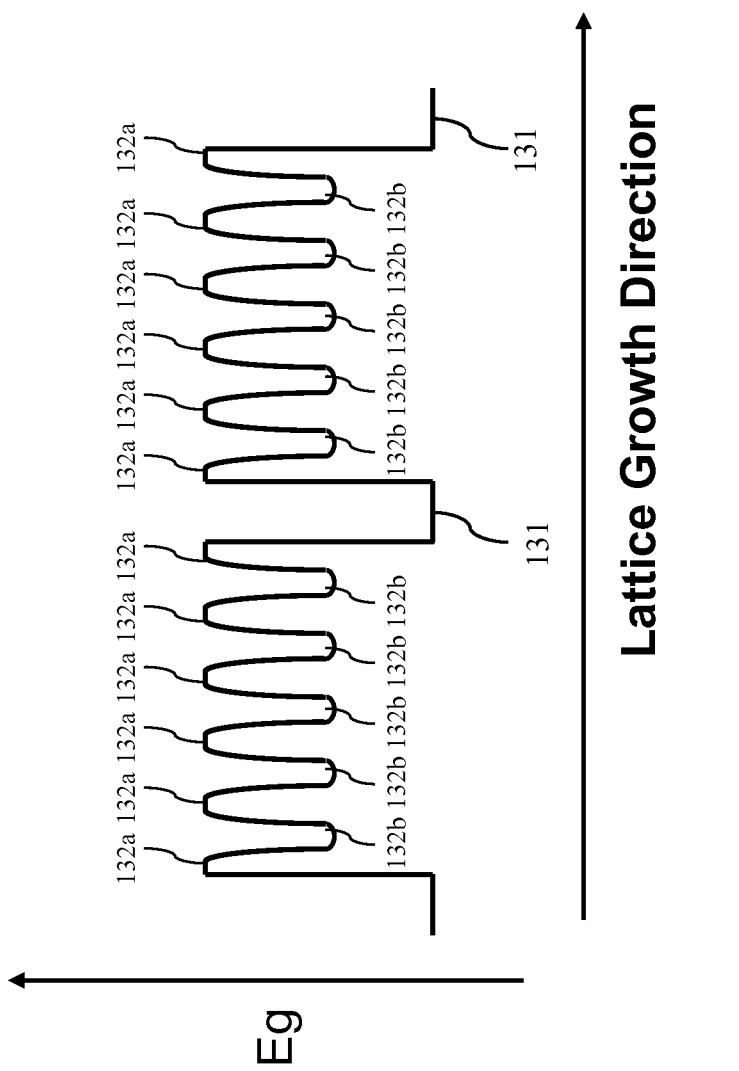
FIG. 4 illustrates the band gap distribution of the active layer in a second embodiment.

FIG. 4 illustrates the band gap distribution of the active layer in the second embodiment. In this embodiment, the first thin layers 132a and the second thin layers 132b have gradually-changing Al and In concentrations. Multilayer potential barrier structure 132 comprises six first thin layers 132a with the same compositions, and five second thin layers 132b with the same compositions. However, the Al and In concentrations inside each first thin layers 132a have gradual variations; the Al and In concentrations inside each second thin layers 132b also have gradual variations. As shown, first thin layers 132a have non-rectangular-shaped barrier structure, and second thin layers 132b have non-rectangular-shaped well structure, resulting from the variable Al and In concentrations within each thin layer. However, from thin layer to thin layer, their compositions are substantially the same, resulting in substantially same barrier height and well depth in the superlattice structure.

Figure 5:
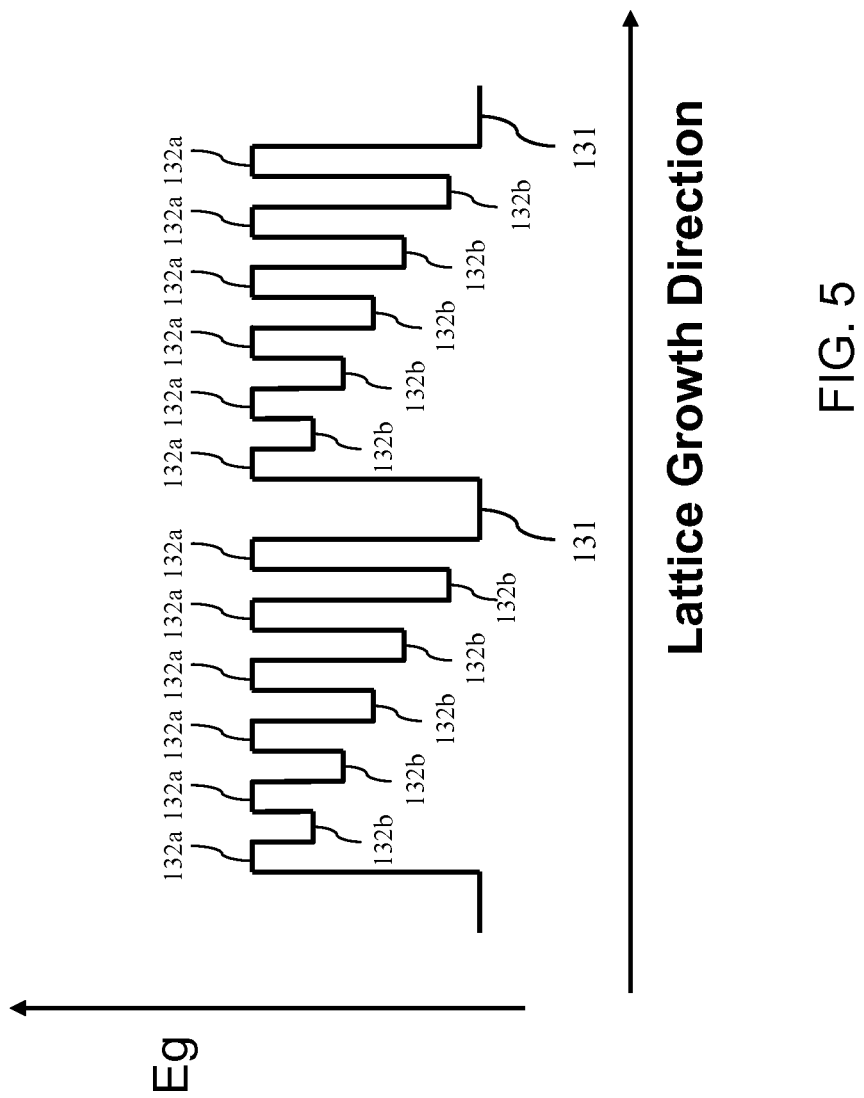
FIG. 5 illustrates the band gap distribution of the active layer in a third embodiment.

FIG. 5 illustrates the band gap distribution of the active layer in the third embodiment. In this embodiment, the Al and In concentrations in the first thin layers 132a are fixed, and the Al and In concentrations in the second thin layers 132b are variable. Multilayer potential barrier structure 132 comprises 6 thin layers 132a with the same compositions, and 5 second thin layers 132b with different compositions. However, the Al and In concentrations inside each second thin layer 132b are fixed. As a result, the superlattice structure still has rectangular-shaped barriers and wells, and the barrier heights are substantially the same, yet the well depths gradually increase toward the well 131 on one side, and gradually increase away from the well 131 on the other side.

Figure 6:
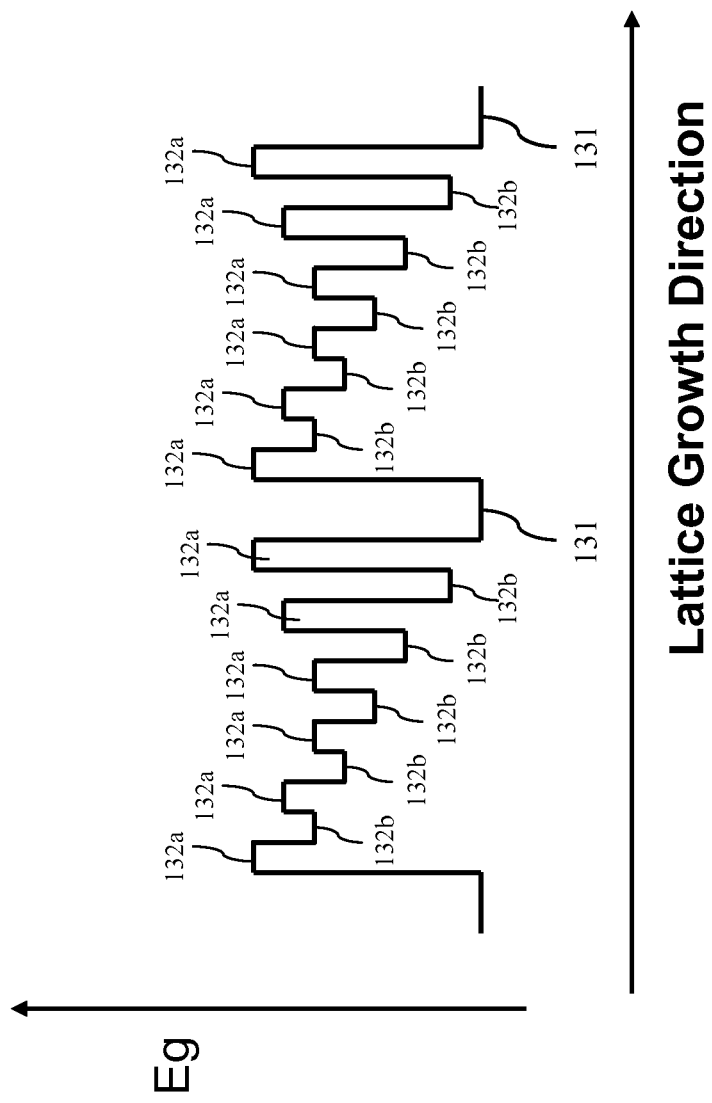
FIG. 6 illustrates the band gap distribution of the active layer in a fourth embodiment.

FIG. 6 illustrates the band gap distribution of the active layer in the fourth embodiment. In this embodiment, the Al and In concentrations in the first thin layers 132a and in the second thin layers 132b are variable. Multilayer potential barrier structure 132 comprises 6 first thin layer 132a with the different compositions, and 5 second thin layers 132b with different compositions. However, the Al and In concentrations inside each first thin layers 132a are fixed, and the Al and In concentrations inside each second thin layers 132b are also fixed. As a result, the superlattice structure still has substantially rectangular-shaped barriers and wells, the well depths gradually increase toward the well 131 on one side, and gradually increase away from the well 131 on the other side, yet the barrier heights of first thin layers 132a first gradually decrease, and then gradually increase toward the well layer 131, forming a "U" shape on both sides of the well 131.

P-type confining layer 140, p-type cap layer 141 and p-type contact layer 142 may be sequentially formed over active layer 130. P-type confining layer 140 may be composed of AlInGaN doped with Mg, with a thickness of 100 Å~600 Å. P-type cap layer 141 and p-type contact layer 142 can be composed of GaN, InGaN, or other GaN family materials, among which the p-type cap layer 141 may have a membrane thickness of 1000 Å~3000 Å, the p-type contact layer 142 may have a membrane thickness of 50 Å~200 Å.

P-type ohmic electrode 150 may be fabricated over p-type contact layer 142, and may have a p-pad electrode 151 disposed thereon. N-type ohmic electrode 160 may be fabricated over n-type layer 120.

In some embodiments, first thin layers 132a and second thin layers 132b are repetitively interlaced and stacked to form polarization-matching and high-potential-barrier multilayer potential barrier structure 132. As a result, the Droop effect of the light-emission efficiency of the nitride LEDs under large-current operations can be significantly reduced, thereby further improving the light-emission efficiency of the nitride LEDs under large-current (high current density) operations. Because the potential barrier layer and the well layer (e.g., InGaN materials) have their lattice constants substantially matched, polarization effect can be reduced. As such, under operations of different current amplitudes, there is no obvious blue shift or red shift phenomena.

In the following, some advantages of the embodiments are described with reference to measured data.

For example, with or without the multilayer potential barrier structure of the disclosed embodiments, two types of samples are fabricated, and their light-emission output power characteristics, light-emission efficiency Droop effect and blue shift under large current (high current density) operations are respectively evaluated. The thickness of each semiconductor layer in some embodiments is listed in Table 1.

TABLE 1

| Layer | Each layer's thickness (Å) and structure according to some embodiments | Each layer's thickness (Å) and structure according to conventional techniques |
| --- | --- | --- |
| Buffer layer 110 | 300 | 300 |
| n-type layer 120 | 25000 | 25000 |
| Active layer 130 | 132 (150 Å)/131 (25 Å) 10 periods (the last being layer 132) 131: InGaN (well layer) 132: first thin layer ($Al_{0.25}In_{0.3}Ga_{0.45}N$) 132a (20 Å)/ second thin layer ($Al_{0.1}In_{0.2}Ga_{0.7}N$) 132b (10 Å), 5 periods (the last being thin layer 132a) | GaN (150 Å)/InGaN (25 Å) 10 periods (the last being GaN layer) |
| p-type confining layer 140 | 600 | 600 |
| p-type cap layer 141 | 2000 | 2000 |
| p-type contact layer 142 | 100 | 100 |

Figure 7:
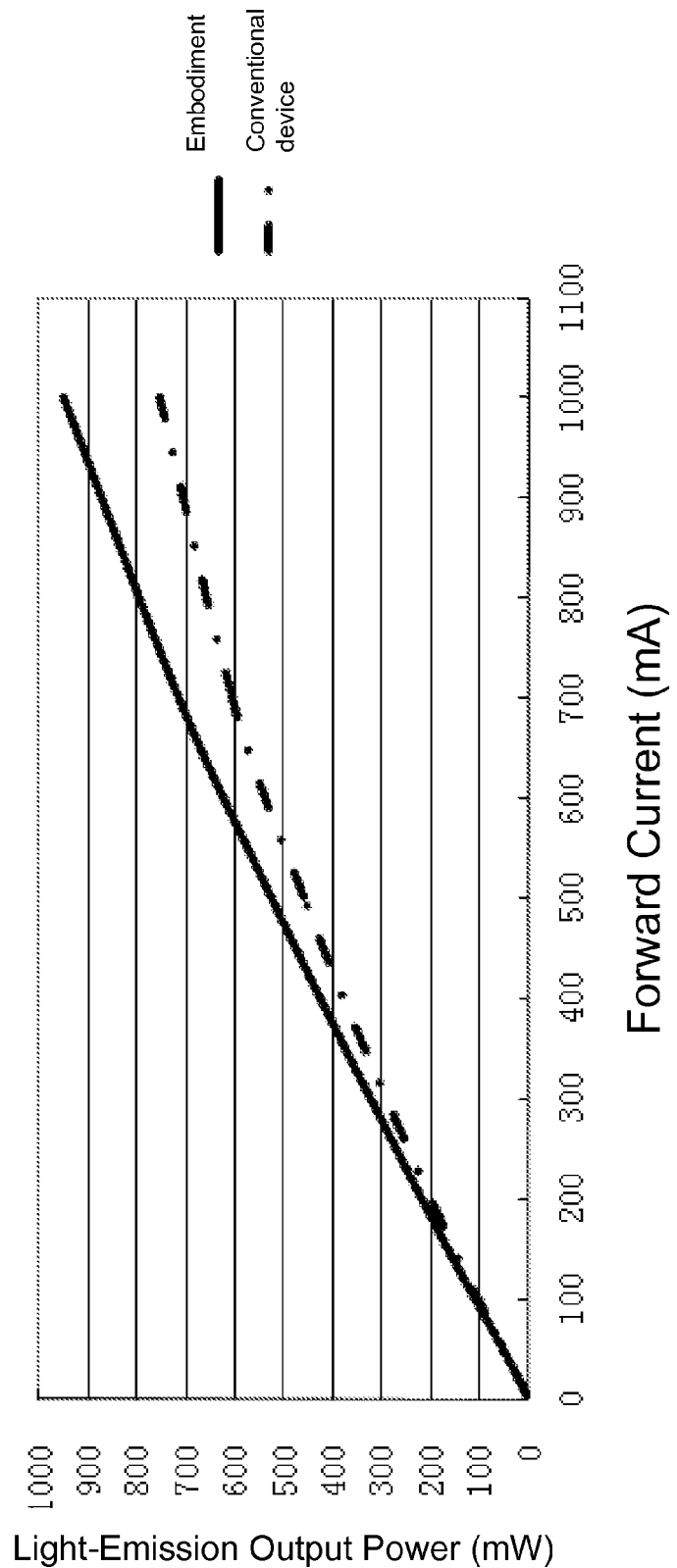
FIG. 7 illustrates the relationship between the light-emission output power and the forward electrical current of a GaN-based LED according to some embodiments.
Figure 8:
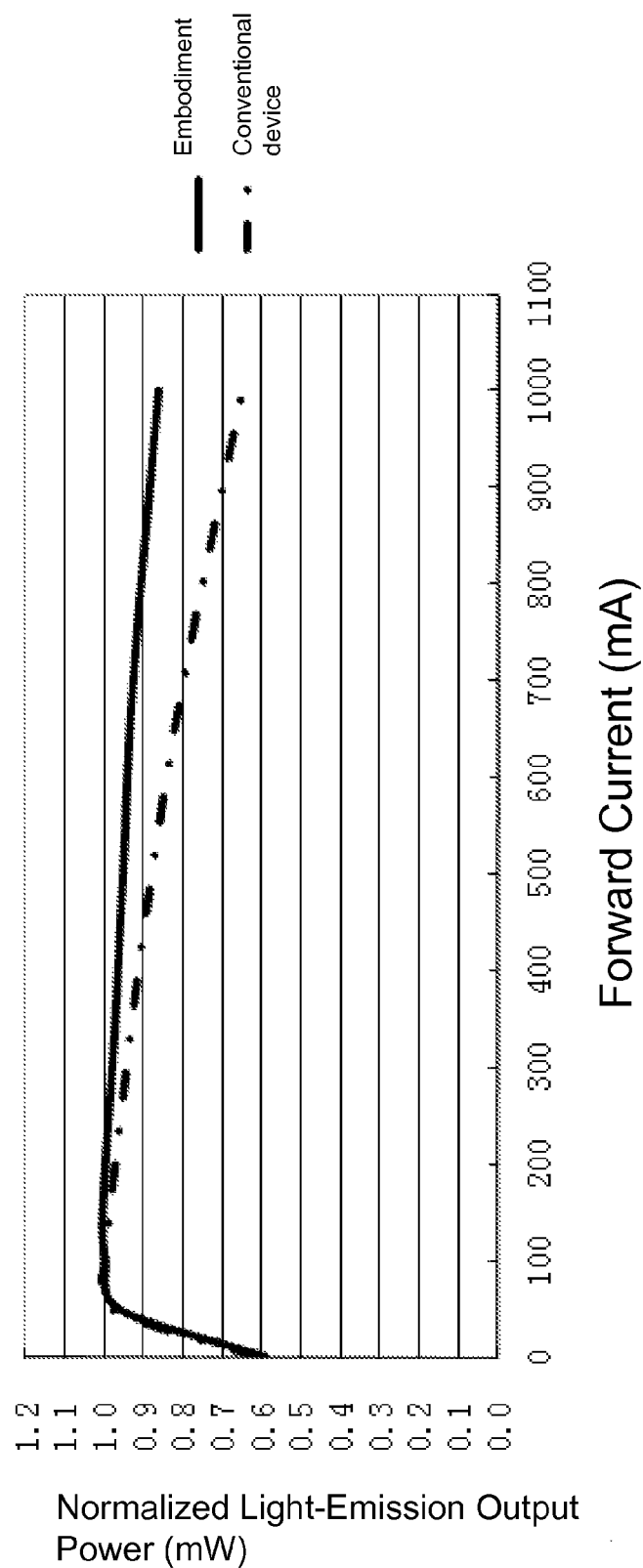
FIG. 8 illustrates the relationship between the normalized light-emission output power and the forward electrical current of a GaN-based LED according to some embodiments.
Figure 9:
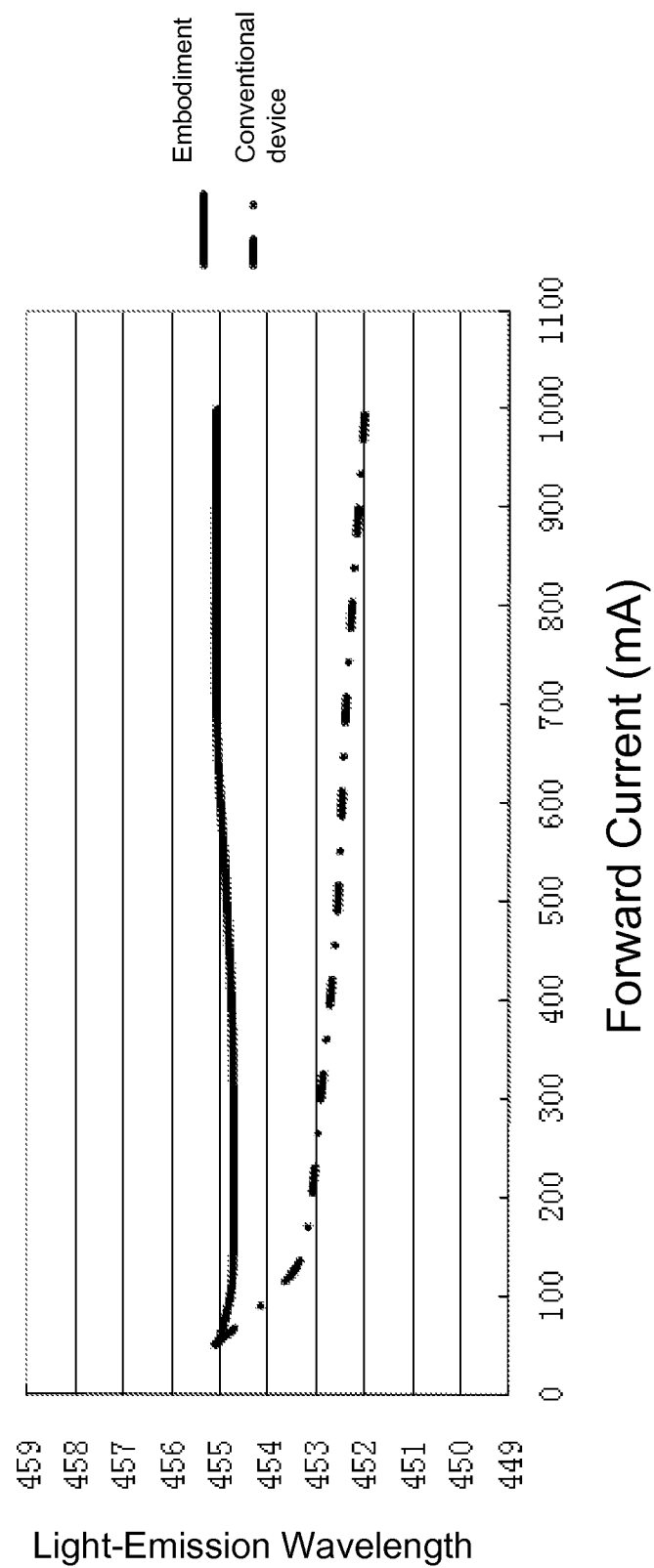
FIG. 9 illustrates the relationship between the light-emission wavelength and the forward electrical current of a GaN-based LED according to some embodiments.

FIGS. 7-9 respectively illustrate, with or without the multilayer potential barrier structure layer, diagrams of the light-emission output power and normalized light-emission output power vs. forward electrical current, and light-emission wavelength vs. forward electrical current.

As shown in FIG. 7, the light-emission output power of the various samples of the nitride LED apparatus samples according to the described embodiments have significantly higher light emission output power as compared with the conventional nitride LEDs.

As illustrated in FIG. 8, the normalized light-emission output power of the various samples according to some of the embodiments, under the large current (high current density) operations, shows that the Droop effect is significantly reduced as compared with the conventional nitride LEDs.

As illustrated in FIG. 9, the light-emission wavelength vs. the forward electrical current of the various samples of the embodiments shows that, under the large current (high current density) operations, the blue shift is smaller than that of the conventional nitride LEDs.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode (LED) comprising:
   an active layer comprising:
      one or more multilayer potential barriers; and
      at least one well layer;
      wherein each multilayer potential barrier comprises:
         interlacing first and second InAlGaN thin layers;
      wherein the first and second InAlGaN thin layers have compositions selected with respect to the well layer such that a polarization effect is substantially reduced;
      wherein the first InAlGaN thin layers each has gradual composition variations therein such that each of the first InAlGaN thin layers has a non-rectangular-shaped barrier structure;
      wherein the multilayer potential barriers and the at least one well layer have their lattice constants substantially matched; and
      wherein the first thin layers are $Al_{x1}In_{y1}Ga_{1-x1-y1}N$ layers with $0.1<x1<0.45$, $0.2<y1<0.4$.

2. The LED of claim 1, further comprising:
   a substrate;
   a GaN-based n-layer disposed over the substrate; and
   a GaN-based p-layer disposed over the substrate.

3. The LED of claim 1, wherein the first and second InAlGaN thin layers form a superlattice structure with a period of at least two.

4. The LED of claim 3, wherein the second thin layers are $Al_{x2}In_{y2}Ga_{1-x2-y2}N$ layers with $0 \leq x2<1$, $0<y2<1$, $x2+y2<1$, and wherein $x1 \neq x2$, $y1 \neq y2$.

5. The LED of claim 4, wherein the multilayer potential barrier has a thickness of $\leq 600$ Å, and wherein $0<x2<0.2$, $0.05<y2<0.4$.

6. The LED of claim 5, wherein the first thin layers each have a thickness of 5 Å-50 Å, with an n-type doping density $<5\times10^{18}$ cm$^{-3}$.

7. The LED of claim 6, wherein the second thin layers each have a thickness of 5 Å-50 Å, with an n-type doping density $<5\times10^{18}$ cm$^{-3}$.

8. The LED of claim 7, wherein the first thin layers each have substantially the same compositions of Al, In, and Ga.

9. The LED of claim 8, wherein within each first thin layer the Al, In, and Ga compositions are variable such that the first thin layer has the non-rectangular-shaped barrier structure.

10. The LED of claim 7, wherein the first thin layers each have different compositions of Al, In, and Ga.

11. The LED of claim 10, wherein the first thin layers have gradually decreasing barrier height and then gradually increasing barrier heights toward the well layer.

12. The LED of claim 7, wherein the second thin layers each have the same compositions of Al, In, and Ga.

13. The LED of claim 7, wherein the second thin layers each have different compositions of Al, In, and Ga.

14. The LED of claim 13, wherein the second thin layers have gradually lower well depth along a lattice growth direction on both side of the well layer.

15. The LED of claim 14, wherein the first thin layers are formed to have gradually decreasing barrier height and then gradually increasing barrier heights toward the well layer.

16. The LED of claim 15, wherein the first thin layers are formed to have gradually decreasing barrier heights and then gradually increasing barrier heights toward the well layer so as to form a "U" shape.

17. The LED of claim 1, wherein the non-rectangular shape comprises a nonlinear shape.

18. A display, signage, or lighting system comprising a plurality of light-emitting diodes (LEDs), wherein each LED comprises:
   an active layer comprising:
      one or more multilayer potential barriers; and
      at least one well layer;
      wherein each multilayer potential barrier comprises:
         interlacing first and second InAlGaN thin layers;
      wherein the first and second InAlGaN thin layers have compositions selected with respect to the well layer such that a polarization effect is substantially reduced;
      wherein the first thin layers are $Al_{x1}In_{y1}Ga_{1-x1-y1}N$ layers with $0.1<x1<0.45$, $0.2<y1<0.4$, the second thin layers are $Al_{x2}In_{y2}Ga_{1-x2-y2}N$ layers with $0<x2<0.2$, $0.05<y2<0.4$, wherein $x1 \neq x2$, $y1 \neq y2$;
      wherein the second thin layers are formed to have gradually lower well depth toward the well layer on one side of the well layer, and gradually lower well depth away from the well layer on another side of the well layer;
      wherein the first InAlGaN thin layers each has gradual composition variations therein such that each of the first InAlGaN thin layers has a non-rectangular-shaped barrier structure; and
      wherein the multilayer potential barriers and the at least one well layer have their lattice constants substantially matched.

19. The system of claim 18, wherein the first thin layers are formed to have gradually decreasing barrier heights and then gradually increasing barrier heights toward the well layer.

20. The system of claim 18, wherein the non-rectangular shape comprises a nonlinear shape.

* * * * *